United States Patent
Nygaard, Jr.

(10) Patent No.: US 6,804,633 B2
(45) Date of Patent: Oct. 12, 2004

(54) FAST EYE DIAGRAM ANALYZER USES NEAREST NEIGHBOR TRANSVERSE TO QUICKLY DISCOVER BASIC EYE DIAGRAMS

(75) Inventor: Richard A Nygaard, Jr., Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 42 days.

(21) Appl. No.: 10/355,308

(22) Filed: Jan. 31, 2003

(65) Prior Publication Data

US 2004/0153266 A1 Aug. 5, 2004

(51) Int. Cl.[7] ............................................. G02F 19/00
(52) U.S. Cl. ........................... 702/189; 702/69; 702/70
(58) Field of Search ........................... 702/189, 67, 68, 702/69, 70, 71, 72, 73, 74, 79; 714/724

(56) References Cited

U.S. PATENT DOCUMENTS

| | | | | | |
|---|---|---|---|---|---|
| 5,343,405 | A | * | 8/1994 | Kucera et al. | 702/73 |
| 6,668,235 | B2 | * | 12/2003 | Nygaard et al. | 702/73 |
| 6,760,676 | B2 | * | 7/2004 | Nygaard, Jr. | 702/79 |
| 2003/0076337 | A1 | * | 4/2003 | Fernando | 345/660 |
| 2003/0083833 | A1 | * | 5/2003 | Nygaard, Jr. | 702/67 |
| 2003/0097226 | A1 | * | 5/2003 | Waschura et al. | 702/65 |
| 2003/0158687 | A1 | * | 8/2003 | Nygaard et al. | 702/117 |
| 2003/0193525 | A1 | * | 10/2003 | Nygaard, Jr. | 345/810 |
| 2003/0202427 | A1 | * | 10/2003 | Nygaard et al. | 368/10 |

\* cited by examiner

Primary Examiner—Patrick Assouad
(74) Attorney, Agent, or Firm—Edward L. Miller

(57) ABSTRACT

The time needed to perform an eye diagram measurement is minimized by initially randomly investigating the $(X, Y)_i$ that lie on a "starting" line crossing the sample space and expected to intersect any eye diagram. This finds a location on the eye diagram. Then the eye diagram is traversed as it is discovered by investigating nearest neighbors of locations found to belong to the eye diagram. Two arrays E and L of bits are established. The bits of E represent "eligible" $(X, Y)_i$, while those of L represent "likely" $(X, Y)_i$. At the very start of the measurement all bits in the eligible array E are set and all those in the likely array L are cleared, except that the starting line is established by setting in L and clearing in E locations for the corresponding $(X, Y)_i$. Thereafter, locations in L that have 1s are measured in a randomly selected order. The presence or absence of activity is duly recorded by the conventional data collection mechanism for use in the resulting eye diagram, and the measured location is then deleted from L by setting the corresponding bit to 0. However, if there was some activity, the nearest neighbors for that $(X, Y)_i$ are promoted from E to L. Promotion means that the corresponding bits are cleared in E and set in L. When no further set bits remain in L, promote from E to L any remaining locations in E on the horizontal rows corresponding the maximum and minimum voltages thus far discovered for the signal. After that the measurement can stop when no further set bit remain in L, or, if desired, any remaining (i.e., unmeasured) locations identified by E can subsequently be measured by promoting them to L.

12 Claims, 11 Drawing Sheets

FAST EYE DIAGRAM ANALYZER USES NEAREST NEIGHBOR TRANSVERSE TO QUICKLY DISCOVER BASIC EYE DIAGRAMS

REFERENCE TO RELATED APPLICATIONS

The subject matter of the present Application pertains to the measurement of eye diagrams in general, and is especially well suited for use with one existing eye diagram measurement technique in particular. An implementation of that existing technique of interest is the subject matter of a U.S. Patent Application entitled METHOD AND APPARATUS FOR PERFORMING EYE DIAGRAM MEASUREMENTS bearing Ser. No. 10/020,673 which was filed on 29 Oct. 2001 by Richard A. Nygaard, Jr. and assigned to Agilent Technologies, Inc. An extension of that technique is also of interest, and it is described in a U.S. Patent Application entitled COMPOSITE EYE DIAGRAMS bearing Ser. No. 10/061,918 which was filed on 31 Jan. 2002 by Richard A. Nygaard, Jr. & Jeffrey J. Haeffele and assigned to Agilent Technologies, Inc. Because the topics described in those Applications are essentially points of departure for the present invention, and for the sake of brevity, "METHOD AND APPARATUS FOR PERFORMING EYE DIAGRAM MEASUREMENTS" and "COMPOSITE EYE DIAGRAMS" are each hereby expressly incorporated herein by reference.

BACKGROUND OF THE INVENTION

Eye diagrams are a conventional format for representing parametric information about signals, and especially digital signals. Various prior art eye diagram testers are known, but we shall call the technique described in "METHOD AND APPARATUS FOR PERFORMING EYE DIAGRAM MEASUREMENTS" and "COMPOSITE EYE DIAGRAMS" (which is the preferred method for use herein), an Eye Diagram Analyzer, or EDA for short.

A modern eye diagram for a digital signal is not so much a trace formed continuously in the time domain (ala an analog oscilloscope), as it is an "eye" shape composed of closely spaced points (displayed dots, or illuminated pixels) representing many individual measurement samples (which are (time, voltage) pairs) taken upon separate instances of a signal occurring on a channel of interest, and which were then stored in a memory. Each measurement sample contributes to a displayed pixel. (In a simple case the correspondence is one to one, but the actual case might be many to one or one to many.) The eye shape appears continuous because the collection of pixels is rather dense, and because the signal is sampled at a large number of nearly adjacent locations. Unlike a true continuous technique, however, there may be detached dots that are separated from the main body of the eye shape. (Such detachment is an artifact of sampling.) A further difference with the continuous analog technique is that rare or infrequently occurring events, once sampled, do not appear faint in the display or disappear with the persistence of the CRT's phosphor. This latter difference is often quite an advantage, since it is often the case that such otherwise "hard to see" features of the trace are very much of interest.

In an eye diagram, an example of which is shown in FIG. 1, the vertical axis is voltage and the horizontal axis represents the differences in time (i.e., various offsets) between some reference event and the locations for the measurement samples. The reference event: is generally an edge of a clock signal in the system under test; represents directly or through some fixed delay the expected point in time when the value of an applied data signal would be captured by some receiving circuit in an SUT (System Under Test); and, is derived from an application of the SUT's clock to the Eye Diagram Analyzer. The time axis will generally have enough length to depict one complete eye-shape (cycle of an SUT signal) centered about the reference, with sometimes perhaps several additional eyes (cycles) before and after.

To one not familiar with eye diagrams FIG. 1 looks like a poorly synchronized or unreliably triggered trace for a periodic digital signal. Let us dwell here briefly to dispel any mystery about why an eye diagram is the way it is. To begin with, it is assumed that a (non-return-to-zero) work signal being measured is synchronous with something, typically a system clock. Let us further suppose that work signal transitions are expected to occur on falling edges of the system clock, so that the work signal is expected to be stable for sampling on the rising edge of the system clock. If we always sampled the work signal at the same time (say, at the rising edge of the system clock), then the results would be repeated instances of one point on the work signal. If the work signal always had the same value (a steady one or a steady zero), then those repeated instances would be the same (time, voltage) values, and would contribute multiple instances of the same single point to the eye diagram. But keep these two things in mind: One, we do not always sample at the exact same time, but vary it on either side of the reference, by up to, or even more than, a clock period. Two, the work signal is typically not stuck at some steady value. It is sometimes a one, sometimes a zero, and sometimes it does not transition.

So, if the work signal were stuck at one or zero, then the varying sample times would produce adjacent points forming straight lines at either the voltage for one or for zero. And if the work signal had regular transitions of one zero one zero one zero . . . then the trace would resemble a square wave (as seen on a 'scope). But most work signals are not that regular: they are sometimes high, sometimes low, and sometimes they stay at the same value from clock cycle to clock cycle. So the eye diagram contains the superposition of all the individual oscillographic trace segments of the two straight lines (one for always high, one for always low) and the transitions from high to low and from low to high. For a properly working signal the central region of each eye is empty, since the good signal never transitions except when it is supposed to.

To continue, then, different (X, Y) regions within a (sample) space containing an eye diagram represent different combinations of time and voltage. Assume that the eye diagram is composed of a number of pixels, and temporarily assume that the resolution is such that each different (X, Y) pixel position can represent a different combination of time and voltage (and vice versa), which combinations of time and voltage we shall term "measurement points." What the preferred Eye Diagram Analyzer measures is the number of times, out of a counted number of clock cycles, that the signal on the channel being monitored passed through a selected measurement point. Then another measurement point is selected, and the process repeated until there are enough measurement points for all the pixels needed for the display. Points along the visible eye diagram trace describe something about those (time, voltage) combinations that were observed to actually occur in the data signal under test. The value of a (time, voltage) combination is represented by its location, but the color or intensity of the measured result can be determined in a way that assists in appreciating the meaning of the measured data. The range over which the measurement points are varied is called a "sample space" and is defined during a measurement set-up operation. And in reality, we define the sample space and the resolution for neighboring measurement points first, start the measurement and then let the analyzer figure out later how to ascribe values to the pixels of the display. The "display" is, of course, an arbitrary graphic output device such as a printer or an X Window of some as yet unknown size in a window manager (e.g., X11) for a computer operating system. (A one-to-one correspondence between display pixels and measurement points is not required. It will be appreciated that it is conventional for display systems, such as X Windows, to figure out how to ascribe values to the pixels for an image when the correspondence between the display's pixel locations and the measurements that are the original image description is not one-to-one.)

Thus it is that a modern eye diagram trace itself is thus not a single time domain waveform (think: 'single valued function'), but is instead equivalent to an accumulation of many such instances; it can present multiple voltage (Y axis) values for a given time value (X axis). So, for example, the upper left-hand region of an eye (see FIG. 1) might represent the combination of an adequate logical one at an adequately early time relative to the SUT's clock signal, and an eye diagram whose trace passes robustly through that region indicates to us that a signal of interest is generally achieving a proper onset of voltage at a proper time. Furthermore, we note that there are also other regions, say, near the center of an eye, that are not ordinarily transited by the trace, and which if that were indeed to happen, would presumably be an indication of trouble. Thickening of the traces is indicative of jitter, a rounding of a corner is indicative of slow transitions, and so on. An eye diagram by itself cannot reveal in the time domain which isolated instance (cycle) of the data signal caused such an exception, as other types of measurements might, but it does provide timely and valid information about signal integrity within a system as it operates. In particular, by incorporating various rules for determining the intensity and color of the displayed pixels of the eye diagram trace (e.g., very long, perhaps "infinite", persistence) the eye diagram presents readily seen evidence of infrequently occurring failures or other hard to spot conditions.

The EDA of the incorporated "METHOD AND APPARATUS FOR PERFORMING EYE DIAGRAM MEASUREMENTS" operates by applying the clock signal from the SUT to a comparator circuit whose output is then delayed by a fixed amount, say about a half cycle, or some integral multiple thereof. The delayed clock comparison is then the reference mentioned above, and it used by determining when individually threshold-compared and then delayed data signals (the SUT data channels) are sampled.

This sampling of the individually threshold-compared and then delayed data signals is actually performed twice in rapid succession, a very brief (but selectable) amount of time apart. If these two successive samples are different, then the input signal transitioned through the voltage region of interest, and we call this a hit. This is the manner of sampling that accomplishes the taking of the (time, voltage) pairs that are the basic data of the eye diagram measurement, and it is an alternative to digitizing with a conventional Analog-to-Digital Converter (ADC). We use it because it works at frequencies that are impractical for ADCs.

It is typical for an Eye Diagram Analyzer to perform measurements simultaneously on a plurality of different data signals, which we shall call channels.

Different sampling voltages are obtained by varying the comparison thresholds for the data signals. In one embodiment different times are obtained by varying the amount of delay in the data channel path, while leaving the clock signal path essentially fixed. In another embodiment the delay in the data channels is held constant (and preferably at a low value) and the delay in the clock signal path is varied. Skew between data channels may be removed by various techniques.

An eye diagram, then, is information about signal behavior at various time-voltage (X, Y) combinations. A simple system would be to indicate that the signal was "there" or that it wasn't. That is, respectively put either an illuminated pixel or a non-illuminated pixel at the various (X, Y) locations for the different instances of "there." This is about what an analog oscilloscope would do if it were used to create an eye diagram for some signal. However, we would notice that some parts of the trace were brighter than others, and understand that this is a (somewhat useful) artifact caused by finite persistence on the one hand (old stuff goes away) and relative rates of occurrence on the other. That is, the display ends up having an intensity component at each pixel location. This is fine as far as it goes, but we would rather not rely upon the persistence of phosphor for this effect, since the most interesting indications are apt to also be the faintest. Since we are not using an analog scope anyway, and have an instrument (an EDA) with memory (akin to a digital oscilloscope, timing analyzer or logic analyzer), we can gather frequency of occurrence ("attendance"?) or degree of similarity ("dispersion"?) data and decide after the fact what distinguishing pixel value is to go with each (X, Y) pixel location. Those pixel values can be variations in color, intensity, or both, according to whatever scheme is in use (and there are several). The general idea is that the operator configures the EDA to render the display in a way that makes the condition he is most interested is quite visible, and also such that the eye diagram as a whole is generally easy to interpret. Thus, the reader is reminded that there is usually more going on than simply the presence or absence of dots at some series of (X, Y) locations, and that we often have recourse to the notion of an associated "pixel value" at each (X, Y) position in the display. We shall denote with the symbol "V" whatever that "pixel value" is. V might be a single item, such as "ON" or "OFF" or it might be an intensity without the notion of color. On the other hand, V will often expand (be rendered) into a whole series of parameters $V_R$, $V_G$, $V_B$, where each such parameter represents the intensity of an associated primary color (whose combination is perceived as a resultant color. In any event, we shall simply write $(X, Y, V)_i$ or perhaps $(X_i, Y_i, V_i)$, depending upon which notation seems to work best for our needs at the time, and not bother to indicate any associated further expansion of a $V_i$ into its rendered component parameters of $V_R$, $V_G$, $V_B$. (And don't forget that the $(X, Y)_i$ are merely handy display system coordinate substitutes for writing the phrase "(time, voltage) pairs".)

It is often the case that the utility of an eye diagram is needed for characterizing or discovering circumstances that are both erroneous and very occasional. It is also the case that some SUTs have a great many channels that are subject to investigation. Some busses have hundreds of member signals, for example. When faced with such circumstances, the "luxury" of having one individual eye diagram trace per SUT signal becomes an oppressive burden. We might measure it that way, and we can indeed display it that way (with four or maybe eight channels at a time), but we likely will have lost all patience and become disgusted with the whole process before we complete looking at twenty-five or more sets of four or more traces each. Surely that is the wrong way to go about analyzing the data! But on the other hand, automating the investigation is risky. Masking measurements, for example, essentially require that we formally decide ahead of time what is not of interest. The analyzer can apply the mask for us automatically and at great speed, but we will never know for sure that there was not some irregularity in there that met the mask criteria, and yet that would have been of interest to us anyway, if we had only seen it.

Accordingly, another tool is needed to assist in eye diagram analysis for situations involving a large number of channels. The needed tool is the merging into one combined eye diagram presentation of the data for separate "component" eye diagram measurements for a useful grouping of related signals. Perhaps this is as simple as taking all the signals together as one single group and producing a single combined eye diagram from the merged data. Say, for example, each separate signal would produce an eye diagram of the same general shape as the other. Then we might simply combine them as if they were being stacked on top of one another, so to speak. That is, create a resulting eye diagram that is the superposition of the component eye diagrams. (The user of a scope might approximate such an outcome by adjustment of vertical position controls to superimpose separate traces.) Alternatively, the signals of interest might, for timing or other signal format reasons, be construed as belonging to some family for one group and to a different family for another group. In that case we are inclined to consider each group separately, and then produce two separate combined eye diagrams, each of which corresponds to one of the groups. In any event, the operator can instruct the EDA to merge the data of individual eye diagrams for a specified plurality (family) of signals into one combined eye diagram. (However, we are going to combine copies of the arithmetic values for the sampled component data, and not mess with any notion of adjusting vertical position!) So now we have a combined eye diagram that probably has fat traces (indicating that, as expected, not all signals have simultaneous and identical rise times, voltage levels, etc.). Independent of that, we now expect that, having merged everything together, if there is something unusual going on, even if only occasionally for just one channel, we will, in principle, be able to see it. (Assuming, of course, that we do not implement some notion of short persistence.) Another assumption in this description is that the collection of data points comprising each of the component eye diagrams has the same general meaning, or type of rule for interpretation, as do the collections of data points in each of the other component eye diagrams.

We shall term such a combined eye diagram, created from the merging of data for individual component eye diagrams, a "composite" eye diagram.

In particular, then, an eye diagram analyzer can assign a plurality of SUT data signals to be members of a labeled group of channels for an eye diagram analyzer. There may be a plurality of such groups. In addition to a superposition in an (X, Y) display space of the various i-many (X, Y, V)-valued pixels for individual component eye diagrams associated with that group, other measured data for those pixels within a group can be merged in various different modes to produce corresponding composite eye diagram presentations. A central issue is to decide how to combine $V_i$ from one component eye diagram with the corresponding $V_i$ of another component eye diagram. They are combined to produce corresponding "densities" $D_i$ of some sort, and we can write either $(X_i, Y_i, D_i)$ or simply $(X, Y, D)_i$ so long as we remember just what D is. If the $D_i$ are rendered with color or intensity, the resulting composite eye diagram includes a representation (the $D_i$) of some density of transitions at each point $(X_i, Y_i)$, relative to that group as a whole. The full disaster for the various different types of density is explained in the incorporated "COMPOSITE EYE DIAGRAMS".

So, we have arrived at the following place. We have an instrument for measuring data signals and producing eye diagrams, which may be individual component eye diagrams for respective individual channels, or one or more composite eye diagrams for one or more respective collections of channels. It will be appreciated that each channel has its own sampling mechanism, so that the entire collection of measurements (the $(X, Y)_i$ pairs) is obtained simultaneously. Nevertheless, the sample space of interest and the desired resolution may combine to require i to be in the millions (or more!). Furthermore, the EDA typically does not set up to measure an (X, Y) pair for some value of i and then simply take one measurement before moving on to another (X, Y) value (for the next value of i). Instead, it is typical for the EDA to dwell on a particular $(X, Y)_i$ for some time, say a thousand or even a million or so clock cycles. The result is that it may take anywhere from a minute or so to several hours to obtain a complete measurement for the entire sample space.

It is true that partial results acquired to date during a measurement can be displayed as the measurement proceeds. But another look at FIG. 1 reveals that somewhere in the vicinity of 80% of the pixels in the display for the eye diagram are dark, or blank. The implication is that a corresponding amount of time is spent measuring activity at locations where there is no activity to be measured. If we could measure mostly signal activity and avoid measuring inactivity the eye diagram measurement could be performed in much less time. It would therefore be desirable if there were a way to steer the selection of the $(X, Y)_i$ so as to first perform measurements where the signal is likely to be found before measuring where it is not likely to be found. This would minimize the amount of time required to perform the measurement to about the lowest practical possible value. The problem is that we don't really know much about the signal (else we would not be measuring in the first place . . . ). So, the question is: "How to do it?"

SUMMARY OF THE INVENTION

A solution to the problem of minimizing the amount of time needed to perform an eye diagram measurement is to first determine at least one location that lies on the eye diagram. This may be done by investigating the $(X, Y)_i$ that lie on a "starting" line, say, parallel to the voltage axis and located near the midpoint of the horizontal time axis of the sample space. Such $(X, Y)_i$ are selected, preferably at random, until one is found that exhibits signal activity. That location is measured, and also those $(X, Y)_i$ that are its eight nearest neighbors (a surrounding layer one deep) or perhaps its twenty-four nearest neighbors (additionally including a second surrounding layer sixteen deep over the first surround layer of eight). These measurement points (the $(X, Y)_i$) are then measured in turn, preferably in random order. The plan is to traverse the eye diagram as it is discovered. To accomplish this, two arrays of bits are established. Within each array the bit locations therein correspond to the various $(X, Y)_i$. One array (E) is used to represent "eligible" $(X, Y)_i$, while the other (L) represents "likely" $(X, Y)_i$. At the very start of the measurement all bits in the eligible array E are set and all those in the likely array L are cleared, except that the starting line is established by setting (1s) in L and clearing (0s) in E locations for the corresponding (X, Y)$_i$. Thereafter, locations in L that have Is are measured in a randomly selected order. The presence or absence of activity is duly recorded by the conventional data collection mechanism for use in the resulting eye diagram, and the measured location is then deleted from L by setting the corresponding bit to 0. However, if there was some activity, the nearest neighbors for that (X, Y)$_i$ are promoted from E to L. Promotion means that the corresponding bits are cleared in E and set in L. Promotion for non-existent nearest neighbors (because they lie beyond a boundary) may be "wrapped" in the appropriate direction to first or last locations in next or preceding rows within the array of the (X, Y)$_i$. When no further set bits remain in L, promote from E to L any remaining locations in E on the horizontal rows corresponding the maximum and minimum voltages thus far discovered for the signal. After that the measurement can stop when no further set bits remain in L, or, if desired, any remaining (i.e., unmeasured) locations identified by E can subsequently be measured by promoting them to L.

Figure 1:
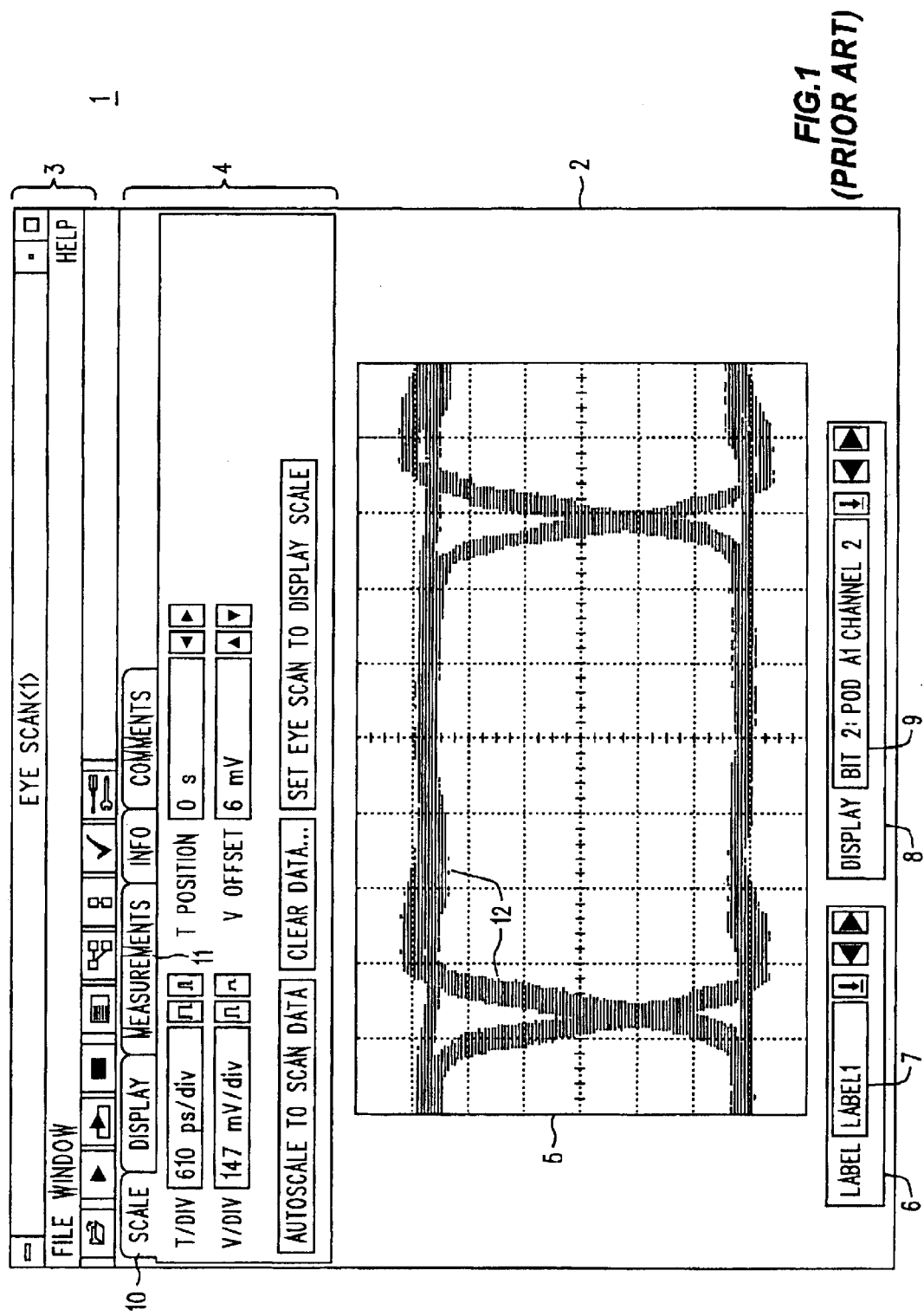
FIG. 1 is a prior art eye diagram presentation of a modern eye diagram analyzer and that serves as a work piece and point of departure for a description of how eye diagram measurements can be made in a minimum amount of time.
Figure 2:
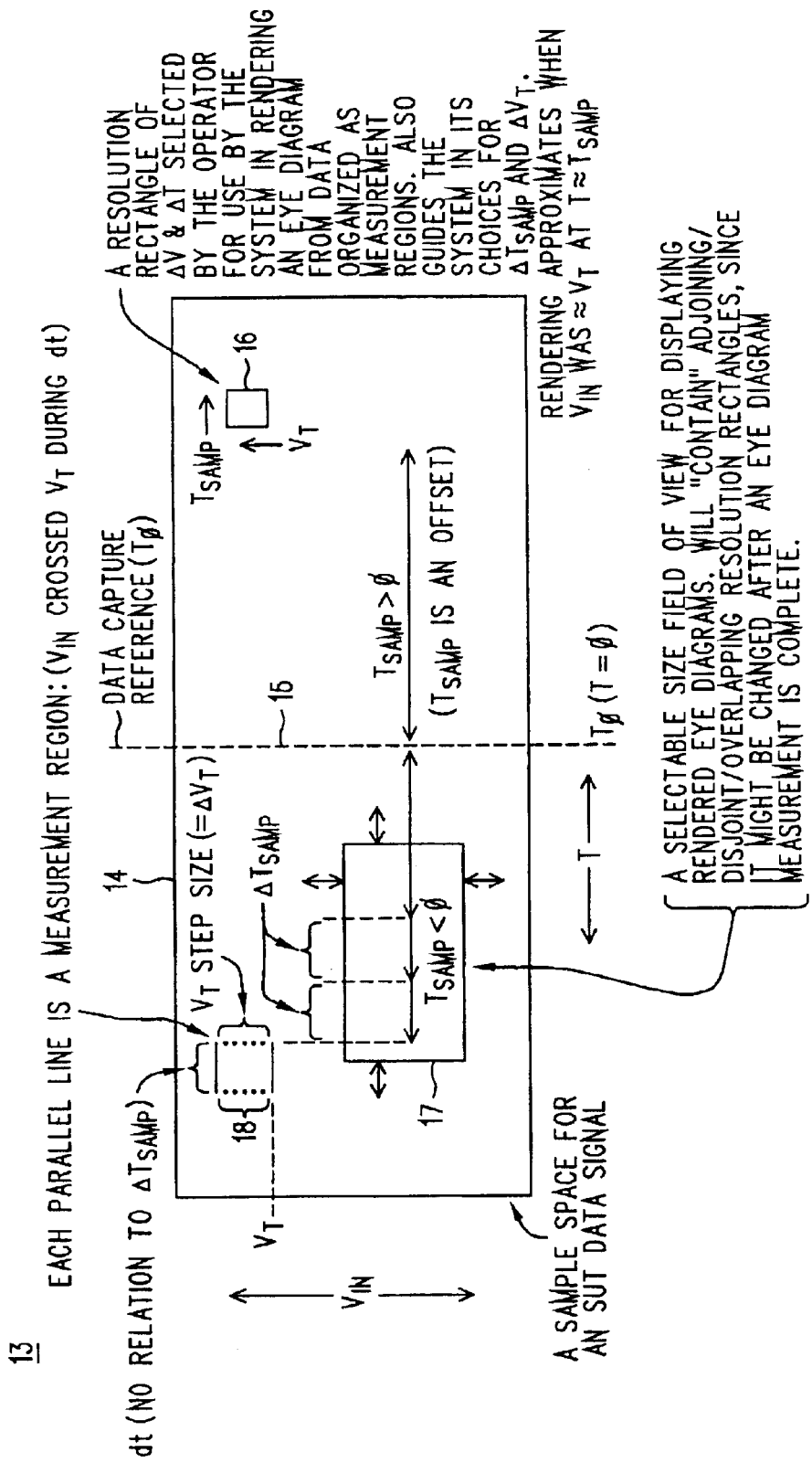
FIG. 2 is a simplified diagram showing the relationship between certain abstractions of interest concerning the size and resolution of an eye diagram measurement performed with a preferred eye diagram measurement technique.
Figure 3:
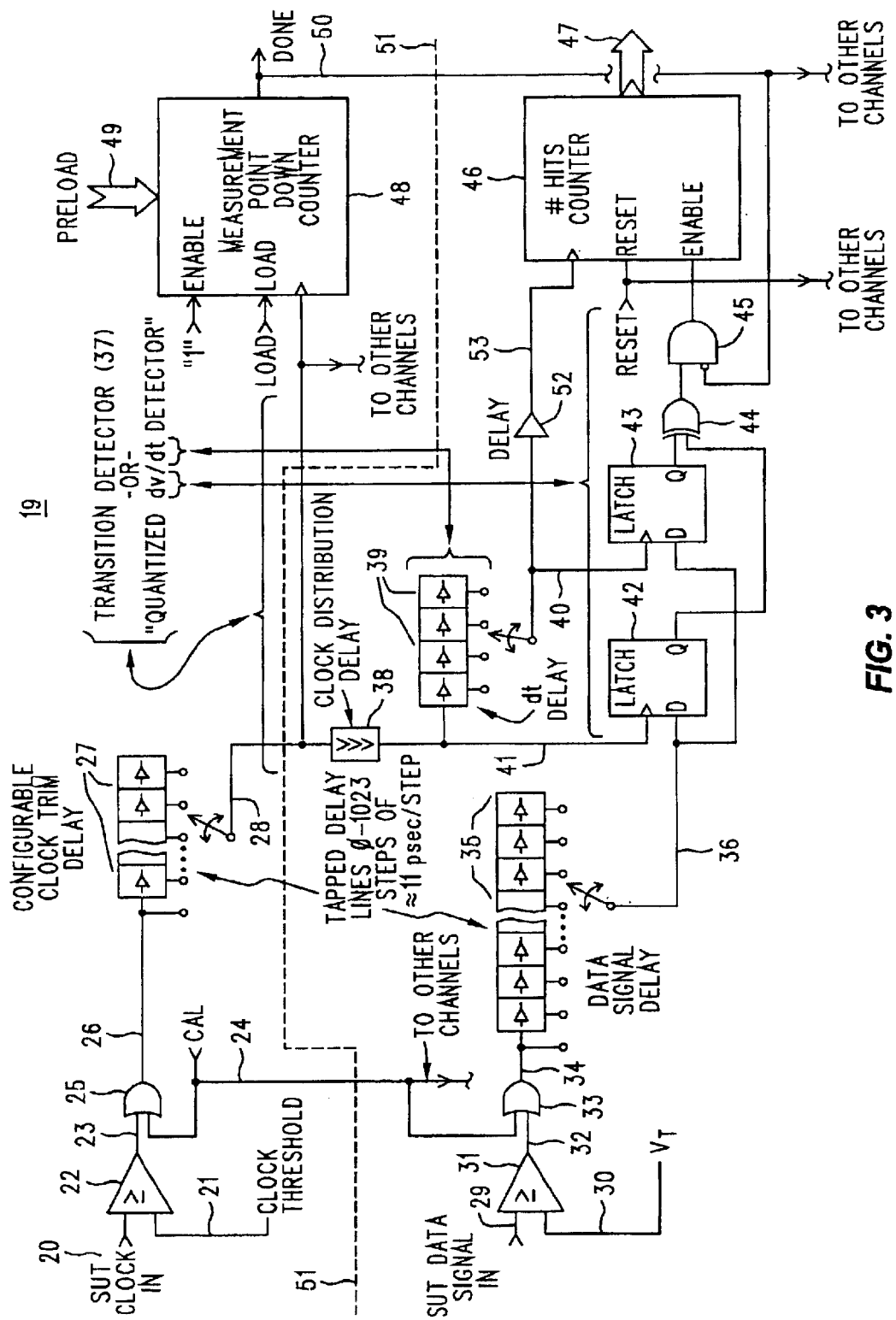
FIG. 3 is a simplified hardware block diagram describing the measurement portion of a preferred eye diagram analyzer.

DESCRIPTION OF A PREFERRED EMBODIMENT (Prior art FIGS. 1–3, and the text that briefly describes them, have been "borrowed" from earlier filed applications, and then "adjusted" for use herein. The intent is to reduce the need to actually consult the incorporated applications. Those already familiar with that subject matter may wish to skip ahead to FIG. 4.)

Refer now to FIG. 1, wherein is shown a prior art eye diagram presentation 1 that will serve as a basis for the examples that follow. In particular, the presentation 1 appears as a graphical image on a graphics output device, such as a CRT or LCD display, or perhaps as a printed image from a printer. The eye diagram analyzer is essentially a special purpose voltage sampling and data storage mechanism operated by an embedded (computer) system controlled by a GUI (Graphical User Interface) running under a commercial merchant operating system. In a preferred embodiment the merchant operating system is HP-UX or some other Unix-like variant, such as LINUX, and the window manager is of the X Windows variety, such as X11 (or one of its variants, say X-FREE11, from GNU). Thus, instead of adjusting controls on a front panel or typing system commands on a keyboard, the operator moves a mouse, or other pointing device, and in a conventional manner "clicks" and "double clicks" on icons shown in the display.

The eye diagram presentation 1 is most typically viewed as an image on a screen (CRT or LCD) and comprises a window 2 whose contents include title and tool bars 3, a "tab" region 4 containing various tabs (e.g., 10 and 11, of which the SCALE tab 10 has been "clicked" to move it in front of the other tabs), and an eye diagram display region 5 containing an eye diagram 12. Window 2 also contains various other boxes and control elements 6–9 that function as part of the GUI and affect the operation of the eye diagram analyzer, for example, by selecting various different modes of operation. In particular, controls 6 and 7 function as a label identification and selection mechanism, where a label can be used to identify a defined collection of signal input channels. Controls 8 and 9 deal with what type of eye diagram is to be displayed in region 5; there are individual component eye diagrams (for one data signal) and composite eye diagrams (say, the merger of all signals in a label). The controls shown in FIG. 1 indicate (6) that while there is a collection named "LABEL1" (7), the particular eye diagram 12 shown (8) in region 5 will be a component eye diagram (i.e., for an individual signal) called "BIT 2" and that is measured by "channel 2" of a probe pod identified as "A1" (9). It will further be noticed that the SCALE tab 10 includes various other information about voltage sensitivity, time scale, and other reference information useful in interpreting the meaning of the eye diagram 12 shown in region 5. Thus, it will be appreciated that under the MEASUREMENTS tab 11 may be found controls that would affect the choices used in determining the strategy for selecting the order in which measurements are made (which in turn, affects how long the measurement might take).

Refer now to FIG. 2, wherein is depicted a diagram 13 showing various relationships of interest. To begin, note the region 14. It is a sample space for an SUT signal of interest. It dimensions are a span of time in the horizontal direction and voltage in the vertical direction. The sample space 14 has a corresponding data structure that is indexed by $V_T$ and the time offset. The vertical direction corresponds to the various possible values that $V_T$ can take, and might have an extent of four volts, or so. The horizontal direction might represent five nanoseconds of activity for the highest permitted SUT clock speeds of 1,500 megacycles per second, or eight nanoseconds at 800 mc.

The sample space has a maximum size, based on the amount of memory available to form the corresponding data structure. There is quite a bit of memory allocated for the data structure, but if, say because there are many channels being measured, provision has been made for it to expand into a mass storage device, such as a disc.

The data structure for the sample space 14 is populated with values (numbers of hits, number of clock cycles measured) by performing runs. Note the horizontal lines 18. We call each line 18 a "measurement region" that represents a value for $V_T$, with adjacent lines being $\Delta V_T$ apart. The length of each line (measurement region) represents the duration dt during which a transition of the input signal through $V_T$ will be recorded as a hit. Thus, each such line segment 18 represents a combination of $V_T$ and dt at some time offset from a reference. The location of one end of the line segment for such a combination is a time offset from a data capture reference 15, which reference 15 we now designate as $T_0$. The offset itself we designate as $T_{SAMP}$. Note that $\Delta T_{SAMP}$ is the step size of $T_{SAMP}$, and that it is not the same as dt. The parameter dt is a duration for which we are sensitive to a transition through $V_T$. Where dt is we call $T_{SAMP}$. Where the next dt starts does not have to be a full dt away from where it used to be, or it might be so exactly, or it might be a lot further away. These changes in position of dt ($\Delta T_{SAMP}$) are not related to the size of dt. We provide much more flexibility in specifying $\Delta T_{SAMP}$ than we do dt, the wisdom of which will be appreciated upon reflection.

The parameters $\Delta V_T$, the upper and lower limits for $V_T$, $\Delta T_{SAMP}$ and its upper and lower limits, originate with selections made by the operator, who is presented choices by the GUI of FIG. 1 and that are stated in terms of the desired resolution for the eye diagram itself. That is, the operator is asked to specify a "resolution rectangle" 16, that may be thought of as a template to be used in mosaic style to impose a grid onto the sample space, within which events are quantized and regarded as indistinguishable. The data structure may be thought of as composed of an arrangement of resolution rectangles, and it is useful to think of the $(X, Y)_i$ as being the various resolution rectangles. That is, if we specified that a particular resolution rectangle was of interest, we could set up the actual measurement hardware (values for $V_T$ and dt) to operate at that location. In a preferred embodiment the range of times for the resolution rectangle is 10–100 psec, while the range for voltage is 1–100 mv. The GUI of FIG. 1 makes the most rational correspondence between the selections made for the resolution rectangle 16 and values for $\Delta T_{SAMP}$ and $\Delta V_T$ that are actually supported by the eye diagram acquisition hardware (to be discussed in connection with FIG. 3). Once $\Delta T_{SAMP}$, $\Delta V_T$ and the limits for $V_T$ and $T_{SAMP}$ are known, the correspondence to the memory of the data structure is thus determined, and the "real" units for the sample space 14 are likewise thus determined. The operator also gets to select one of four values for dt, and the length of the run in terms of a number of SUT clock cycles. At this point the runs to populate the data structure can begin when desired.

Now it may happen (and it often will) that the size and resolution afforded by the sample space and the data structure exceed the information capacity needed to produce a particular eye diagram of interest, but that after a measurement is complete, the location of interest within the sample space may change, or the size of the area of interest may change. The operator would like to zoom and pan amongst the acquired data. To accommodate this, the operator is invited to specify a field of view 17 of selectable size. The field of view 17 is rather like a clip window in a graphics system for a graphics workstation. One of the main tasks of various processing algorithms associated with the EDA is to render as an eye diagram that portion of the data structure that corresponds to the field of view 17, according to the specified resolution rectangle.

The rendering process involves the following ideas. Just as the field of view 17 is a window into the sample space/data structure, a certain portion of the displayable collection of pixels (on the CRT screen, page of printer paper, etc.) have been allocated for display of the eye diagram. A supervisory process internal to the EDA, operating in cahoots with the operator, makes this choice. Clearly, if eye diagrams for five channels are to be displayed in a given (X, Y) region of the display's raster, less space is available for each eye diagram than if there are only two channels, instead. The number of display pixels in X and Y available to represent an individual eye diagram, in conjunction with the size of the field of view 17, allow the determination of a correspondence between those pixels and the time/voltage data entries of interest in the data structure. The correspondence can be one-to-one, or many-to-one in either direction. Also, the nature of the correspondence need not be integral. The rendering process examines all these correspondences to determine which pixels in the displayed eye diagram are to be illuminated. Places in the eye diagram that have different numbers of hits may be illuminated differently than those that have just a few. It may be the case, for example, that a solitary hit or small number of hits is very important hard-to-find information, and should be prominently displayed. On the other hand, there can be other times when the rendering of the trace should reflect how prevalent the corresponding occurrences are, and the data are construed as a fraction (number of hits out of how many measured clock cycles). Selecting trace intensity and color as a function of such things are part of the rendering process, and occur in response to modes of operation and parameters specified by the operator. To be sure, this rendering is a complicated task, but nonetheless it is performed in a way that is already known in itself.

Refer now to FIG. 3, which is a simplified block diagram 19 of the measurement hardware associated with each SUT data signal that can be the subject of an eye diagram measurement. What is shown in the figure is one SUT clock section above dotted line 51 and one SUT data signal section below dotted line 51. This would accommodate a single channel measurement. It will be appreciated that for additional channels there would remain the single SUT clock section, while additional corresponding data signal sections would be added, one for each channel. In connection with this, we have shown certain signals (a RESET, DONE, CAL and a delayed clock) that are sent to any additional data signal channels.

The SUT clock input 20 is applied, along with a clock threshold voltage 21, to the inputs of a comparator 22. The nature of the comparator is that it produces an output 23 whenever the SUT clock input 20 is greater than or equal to the clock threshold voltage 21. The operator can specify the clock threshold voltage.

In similar fashion, the SUT data signal input 29 is applied, along with a (possibly channel specific) data threshold voltage $V_T$ 30, to the inputs of a comparator 31. The nature of the comparator is that it produces an output 32 whenever the SUT data signal input 29 is greater than or equal to the threshold voltage $V_T$ 30. The operator can specify the threshold voltage $V_T$.

In a preferred embodiment all this circuitry is implemented within an IC. The effective values of the thresholds, as well as those of the various to delays to be encountered, are somewhat a function of temperature and other causes of drift. To minimize the mischief caused by such drifts we prefer to frequently adjust one of the variable delays (to be discussed below) to produce an indication of simultaneity (zero relative delay) under an imposed controlled condition. That controlled condition is that comparator output signals 23 and 32 transition at the same time. Rather that disturb the circuitry of the comparator (which is practical) we show OR gates 25 and 33 that allow a CAL signal 24 to accomplish the same effect. So, at the start of each run we arrange that the two comparators 22 and 31 will not otherwise produce an output (very high thresholds, remove an ENABLE signal or turn off something upstream in the signal paths, etc.) and apply a suitable square wave CAL signal 24. We do that continuously until some adjustment (described in due course) produces a satisfactory result (a close approximation of zero relative delay).

To continue, then, the output of OR gate 25 is signal 26, which is applied to a CONFIGURABLE CLOCK TRIM DELAY circuit 27. We have shown this circuit 27 as though it were a cascaded series (say, one thousand twenty-three in number) of non-inverting buffers whose input and series of successive outputs are selected by a switch (as in a MUX) to become a variably delayed version 28 of the input. Each buffer has the same delay, which is somewhere in the ten to twelve picosecond range. Let us call the delayed output a partially delayed clock signal.

The series of cascaded non-inverting buffers is a good way of achieving the needed functionality, which is that of an electrically variable delay line. In particular, for a digital signal it mimics the ability of an actual analog delay line to impart phase delay to an entire waveform, which is the basis for our being able to position dt at a location many cycles away from $T_0$. This is something a mere pulse delay circuit could not do. A cascaded series of buffers is not infinitely variable, however, and the quantizing of the delay according to a stage of buffering limits the ultimate bandwidth. No matter, we can live with both effects, since we are dealing with clocked digital signals in what ought to be a synchronous environment. The extra "continuity" that a genuine delay line (e.g., a long transmission line) would afford is not a necessity in making our eye diagram measurements.

Since there is to be but one clock signal for however many data channels are involved, the output 28 from the CONFIGURABLE CLOCK TRIM DELAY circuit 27 must be distributed to the vicinity of the data signal hardware (the stuff below line 51) for those however many channels, some of which may be in different ICs or on different printed circuit assemblies. The significance of this is that there are different delays in getting the partially delayed clock signal 28 to where its needed within each channel. We represent this by the box 38 labeled CLOCK DISTRIBUTION DELAY. The output of box 38 (there is no lumped delay there—the lumped delay is an equivalent to the distributed delay that is real, but awkward to show) might be termed the real delayed clock signal. It is the case that the CLOCK DISTRIBUTION DELAY is not the same amount for each channel, but they are within, say, five percent of each other. So, the various 'real delayed clock signals' are not truly simultaneous, but we can live with that, since it is going to turn out that we need to zero for relative delay within each channel, but do not need to zero for simultaneity across channels.

Return now to the data signal path below line 51, which, it will be recalled, is for one channel. The output 34 of OR gate 33 is applied to another tapped delay line (DATA SIGNAL DELAY) 35 that is of the same nature as the CONFIGURABLE CLOCK TRIM DELAY circuit 27. Its output 36 is applied to the D input of a latch 42 that is clocked by that channel's real delayed clock signal 41.

Before proceeding, let's pause a moment and take care of the CAL situation. After that it will make sense to describe how the tap settings for the two delay lines 27 and 35 are selected for a run. Assume now that the CAL signal (a square wave of convenient frequency) is present. Let the CONFIGURABLE CLOCK TRIM DELAY circuit 27 be at some tap. Now, considering the CLOCK DISTRIBUTION DELAY for each channel, it is possible to adjust the DATA SIGNAL DELAY circuit 35 so that latch 36 has stable and different values about one setting of the tap for the DATA SIGNAL DELAY circuit 40. We'd like that tap to be about in the middle of 1024 possible positions, so we vary the tap for the CONFIGURABLE CLOCK TRIM DELAY circuit 27 to get the tap for circuit 35 about in the middle. What's more, there are likely several (or a great many) data channels in use, so we can't get them all the same, since the various associated CLOCK DISTRIBUTION DELAYS are likely all somewhat different. But they are distributed about some average value, so that for the group, we can pick a tap for the CONFIGURABLE CLOCK TRIM DELAY circuit 27 such that the CAL setting for the taps of the various DATA SIGNAL DELAY circuits are each near their middle. The effect of this compromise will be that not every data channel will have the same range of relative delay available (we will use that relative delay to make the offset from $T_0$), but there is still plenty, anyway, so that is what we do.

To resume the discussion of how to make a run, each channel further delays its copy of the real delayed clock signal 41 to produce a doubly delayed clock signal 40. This is accomplished by a dt delay circuit 39 of, say, four tapped delays of 70 ps, 120 ps, 170 ps and 220 ps. The doubly delayed clock signal 40 clocks a latch 43 whose D input is also the (same) delayed data signal applied to latch 42. The idea is that if the two latches 42 and 43 have different values (detected by XOR gate 44) after both have been clocked, then the SUT DATA INPUT SIGNAL 29 must have transitioned through $V_T$ sometime during the interval between when latch 42 was clocked and latch 43 was clocked. We have called that time interval dt in connection with FIGS. 1 and 3. The value of dt is the delay provided by the dt delay circuit 39.

It will be recalled that dt is a sampling window in time whose location is at an offset $T_{SAMP}$ from $T_0$. (See FIG. 2.) It will now be clear that $T_0$ is the CAL condition we set out above (zero relative delay between the signals 36 and 41), and that by varying the tap of the DATA SIGNAL DELAY circuit 35 in both directions we create signed amounts of the offset $T_{SAMP}$ (i.e., we invoke values of $\Delta T_{SAMP}$).

The output of XOR gate 44 is applied, through AND gate 45, to an ENABLE input of a # OF HITS COUNTER 46, which may be reset at the beginning of each run. The # OF HITS COUNTER 46 is clocked (made to count if enabled) by a signal 53 that is a delayed (by delay 52) version of the doubly delayed clock signal 40. The extra delay 52 allows latch 43, XOR gate 44 and AND gate 45 to get set up (which, if it happens, enables the counter to count).

The run continues until enough SUT clock cycles have been examined. That number is determined by a value 49 that is pre-loaded into a MEASUREMENT POINT DOWN COUNTER 48 at the start of the run. Each SUT clock cycle decrements the pre-loaded count by one. When it reaches zero a signal DONE 50 is generated, which, among other things signals the EDA system supervisor that the run is complete and removes the ability to enable the # OF HITS COUNTER 46.

At this time the value 47 accumulated in the # OF HITS COUNTER 46 is stored by the EDA system in the indexed location of the data structure, along with any other information deemed useful, such as the value 49 of the pre-load for counter 48. It will be noted that the block diagram 19 suggests that this happens in an instance by instance manner. It will also be appreciated, however, that while the block diagram gives the proper functionality to be obtained, it is often desirable for performance reasons to employ additional techniques such as pipelines, parallelism and MUX'ing of cached results to 'get things to run faster than they really do'.

After each run a new combination of $V_T$ and $T_{SAMP}$ are instituted, and another run conducted, until there have been as many runs as needed, or the operator manually indicates that the measurement should be terminated.

Thus, to this point we have described one particular way in which individual measurements needed to create an eye diagram of the sampled (as opposed to the analog) variety can be produced. The eye diagram itself is produced by an examination of a data structure populated by the sampled measurements we have just described. Each sampled measurement involves determining hits within a specified resolution rectangle 16, which corresponds directly to what we earlier called the $(X, Y)_i$. (The subscript i enumerates the different locations of measurement rectangles.)

There are a number of things to be noted before we proceed. First, we note that if sample space 14 is large compared to the resolution rectangle 16, we may have to wait a comparatively long time for the eye diagram to emerge from the measurements. Especially so, if the field of view 17 is also small compared to the sample space 14, and if the number of samples to be taken at each resolution rectangle 16 is high. It is possible to configure measurements that take hours to perform in their entirety.

Second, we note that, as far as the overall measurement goes, there is no appreciable effect produced by selecting one sequence of specified measurement rectangles instead of another; the final completed eye diagram will be the same (or at least as similar as one might expect from one run to another, since there is a statistical aspect to the behavior of the measured signal). That is, we could traverse the measurement rectangle 16 across the sample space 14 in raster scan fashion, say from upper left to lower right by left-to-right lines, or the measurement rectangles could be selected in some other fashion. The idea here is that, for a complete measurement, some large number of different instances of resolution rectangle need to be invoked, and the order in which they are visited does not have any identifiable effect on the completed result. However, we note that perhaps about 80% of the various trial measurement rectangles will produce no hits. So, we'd prefer to measure first those that do produce hits. That is, let's produce the trace first and the empty space (if we still want it) second. To do that we need a useful way to get control over which measurement rectangle is visited next.

Third, we note that even in the case a different type of measurement mechanism is in use (say, a sampling digital oscilloscope has been subverted to make the measurements with an actual analog to digital converter, instead of the threshold-based transition detection scheme of FIG. 3, or, perhaps a Bit Error Rate Tester, or BERT), it is still the case that independent control over the location of the $(X, Y)_i$ (i.e., the scope's samples corresponding to the locations of the resolution rectangles) can be exercised to favor measuring the actual trace (hits) prior to measuring locations in the sample space where there is no trace.

Accordingly, what will concern us henceforth is how to do exactly such a traverse of the eye diagram trace, independent of the actual measurement technique used to ascertain if a given $(X, Y)_i$ receives hits.

Figure 4:
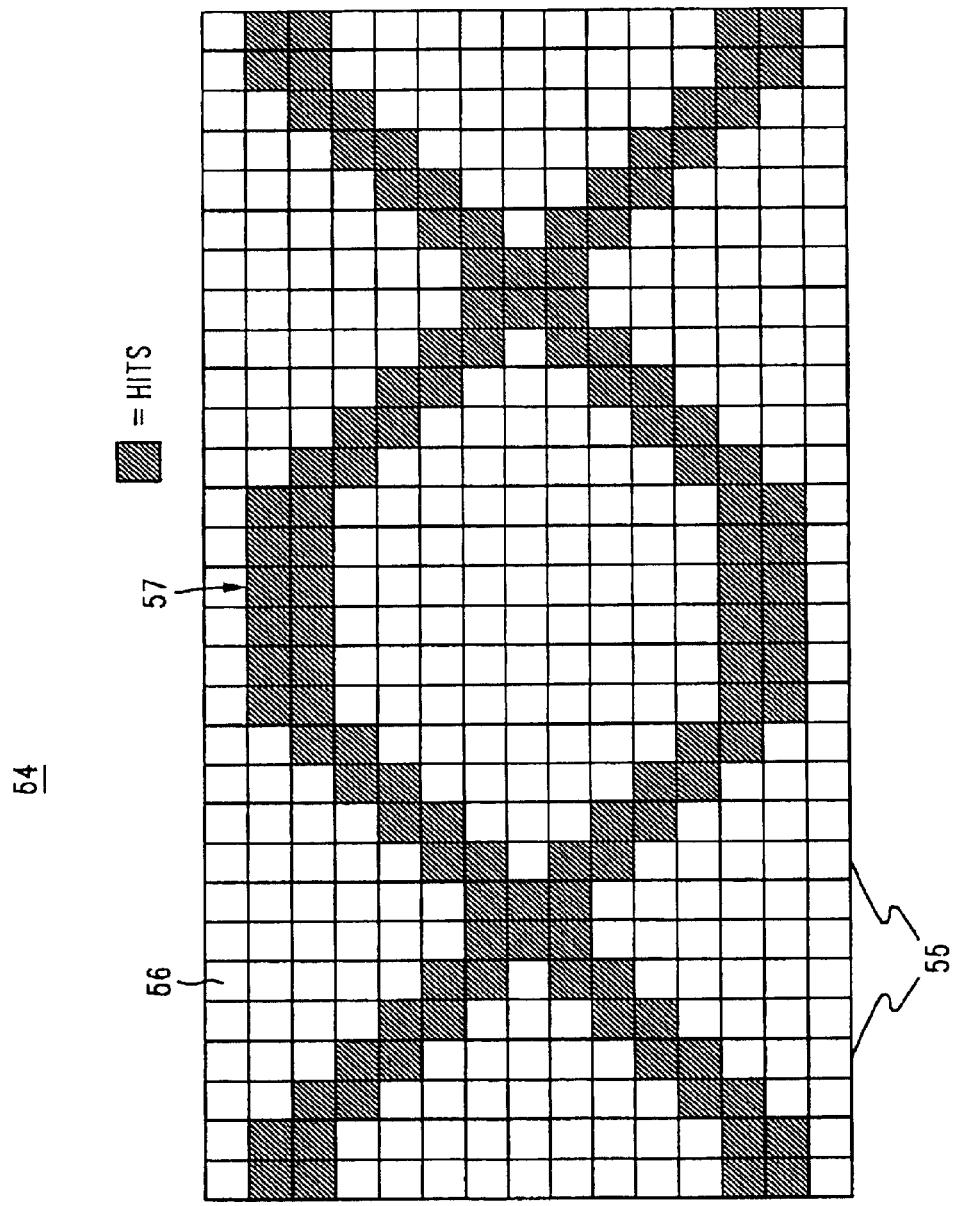
FIG. 4 is a simplified eye diagram taken as a starting point for the remainder of an explanation for the operation of a nearest neighbor traverse of an eye diagram.

Referring now to FIG. 4, note that it is a simplified depiction 54 of an example eye diagram 57. A sample space 55 is made up of a number of resolution rectangles 56. In this particular case the number is four hundred fifty, the sample space being thirty by fifteen. As a real world example these numbers are a bit on the low side, perhaps by at least a factor of ten, but it still suits our purpose and results in a practical drawing. The reader is reminded that the user has control over the size of the sample space and the size of the resolution rectangles. The purpose of FIG. 4 is to illustrate a work eye diagram 57 that will be used in connection with subsequent figures in an explanation of how a fast eye diagram measurement may be obtained by traversing the eye diagram as it is being measured. Naturally, that process does not have the benefit of knowing in advance where all the hits are (i.e., the traversing algorithm has no FIG. 4 to guide it). However, for the benefit of the reader, we provide FIG. 4 to assist in appreciating how the traversing algorithm does what it does.

Figure 5:
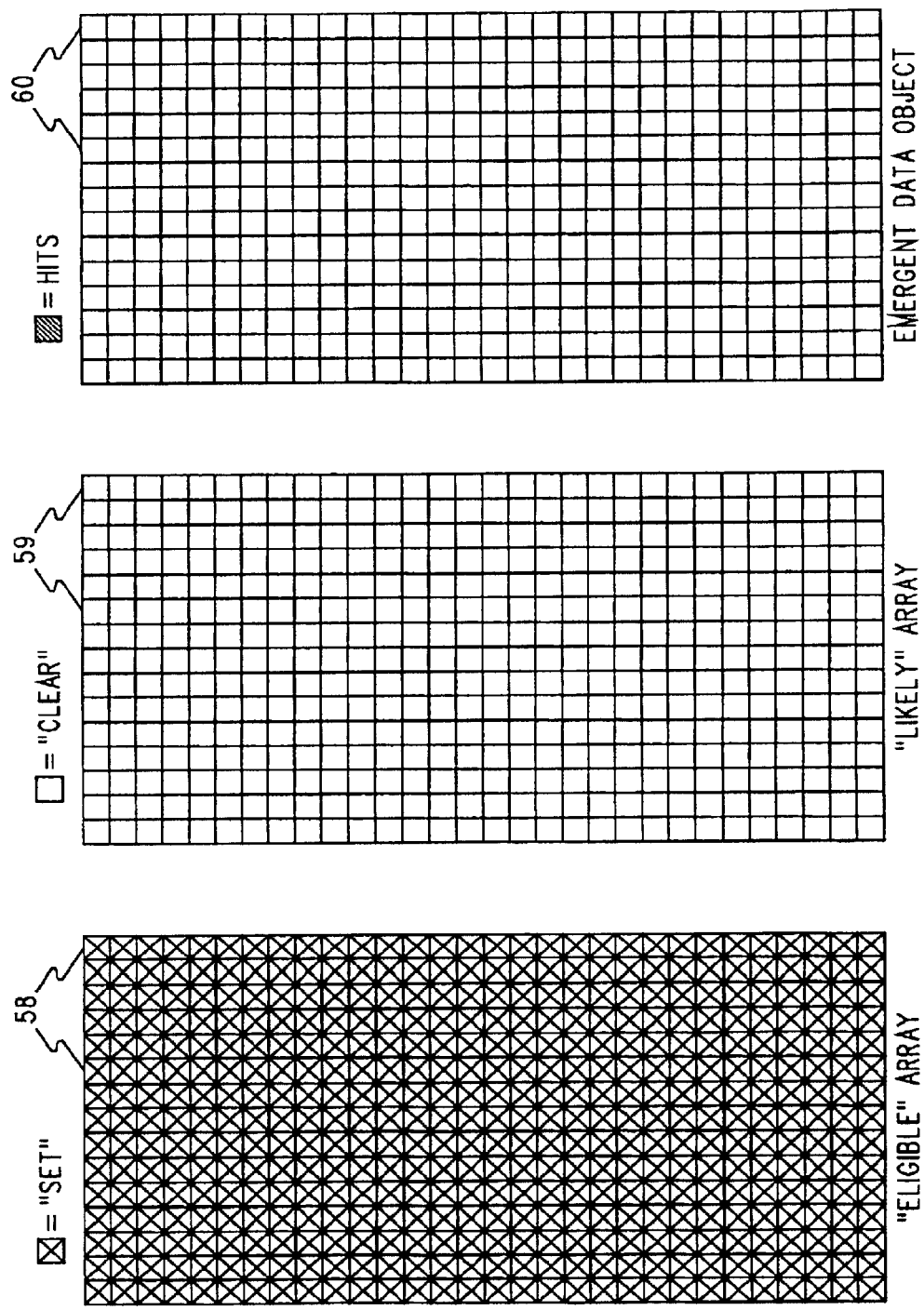
FIG. 5 is a simplified depiction of initial conditions of three arrays used in steering the operation of the nearest neighbor traverse.

Refer now to FIG. 5, and note the three arrays 58, 59 and 60. These arrays have the same dimensions along the time and voltage axes as the sample space 55 of FIG. 4. Furthermore, while we show them as three disjoint planes, they might be (depth-wise) partitions in a single array. In such a case, the plane, partition or layer thereof corresponding to arrays 58 and 59 might each be one bit capacity, while the plane, partition or layer for array 60 could be of as many bits of capacity as needed to record the numbers of hits. In this connection, it is fair to think of some single combined layer for 58 and 59 that is two bits per address, one bit being the bit for what was array 58 and the other for what was array 59. Those are all issues of implementation and notation; we have shown a structure that is easy to appreciate, and that lends itself to following the operation of the traversal algorithm as its operation proceeds. And, while it might work out that each resolution rectangle corresponds to a pixel location in the final display, that is by no means necessary. Panning, zooming and the relative sizes of the sample space and the display mechanism all have an influence on the correspondence between the resolution rectangles (which are the "unit of measurement" for the EDA's hardware) and the pixels in the final visible image. That said, it will be convenient for us to assume that there is exact correspondence between the various measurement rectangles and the pixels of the display.

To continue, then, array 58 is an ELIGIBLE array, array 59 is a LIKELY array, while array 60 is used to retain an emergent data object (the sought after eye diagram). The ELIGIBLE array 58 is used to indicate which resolution rectangles are potential contributors to the final measured eye diagram. At the beginning of a measurement all resolution rectangles are potential contributors. Accordingly, at the beginning of a fast eye diagram measurement we set all locations in the ELIGIBLE array 58. This is indicated by the X's throughout the array 58. (The use of X's and blanks in the drawings is a less cluttered visual device than the 1's and 0's that actually occupy the corresponding memory of real hardware.) In essence, we are going to use the ELIGIBLE array 58 to keep track of where in the sample space we have already measured, so we don't measure it again. We are going to need that, since we will not be using a simple raster scan technique that retains that information in two subscripts that are incremented as are indexes in nested loops of programming.

Also at the beginning of the measurement we clear all locations in the LIKELY array 59 (note the absence of X's), and remove any indications of hits from the array 60 representing the EMERGENT DATA OBJECT.

Figure 6:
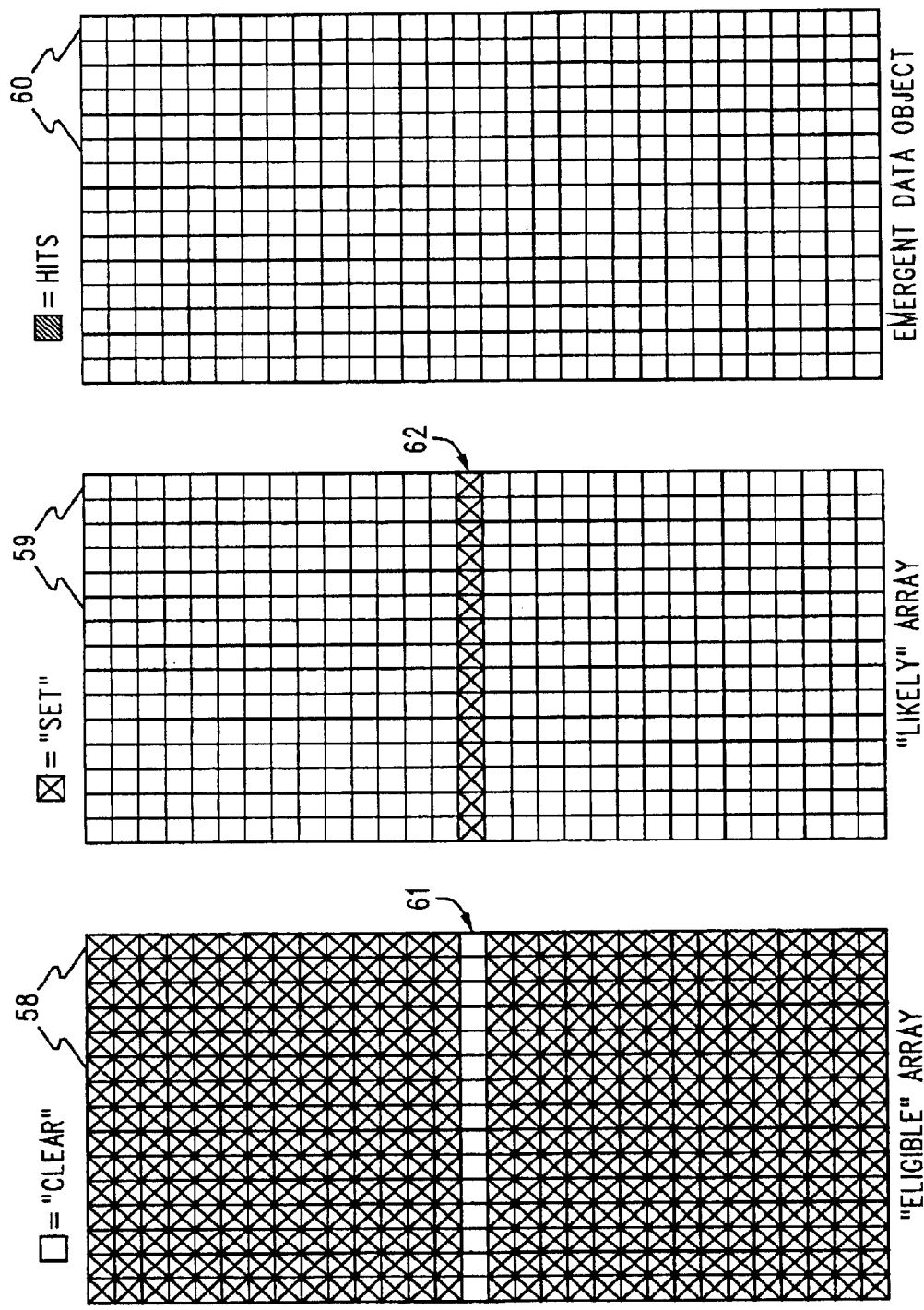
FIG. 6 depicts the promotion of a "starter line" from an ELIGIBLE array to a LIKELY array, from which LIKELY array locations are randomly sampled.

Refer now to FIG. 6. We are going to "follow" the eye diagram by an inspection of nearest neighbors for hits discovered. To do that we need to find some hits. We don't know exactly where they will be discovered, but we do believe that if there is an eye diagram to be found, then a vertical line (in the voltage axis) located at or near the midpoint along the (horizontal) time axis will describe locations that should intersect the eye diagram. (Actually, we prefer to put the vertical line at or near the position of the time axis where the reference is, with the expectation that it will intersect the upper and lower horizontal eye opening.) Accordingly, we "promote" such a vertical line 61 from the ELIGIBLE array 58 into the LIKELY array 59, where it re-appears as line 62. To do this the line 61 is cleared (the X's go away) and line 62 is set (with X's). Having the vertical line 61 exactly in the middle of the time axis is not particularly important, and may not be possible, anyway. (Our example has an even number of horizontal locations, and one of them is consumed to hold the vertical line. So there cannot be an equal number of each side of that line . . . )

Figure 7:
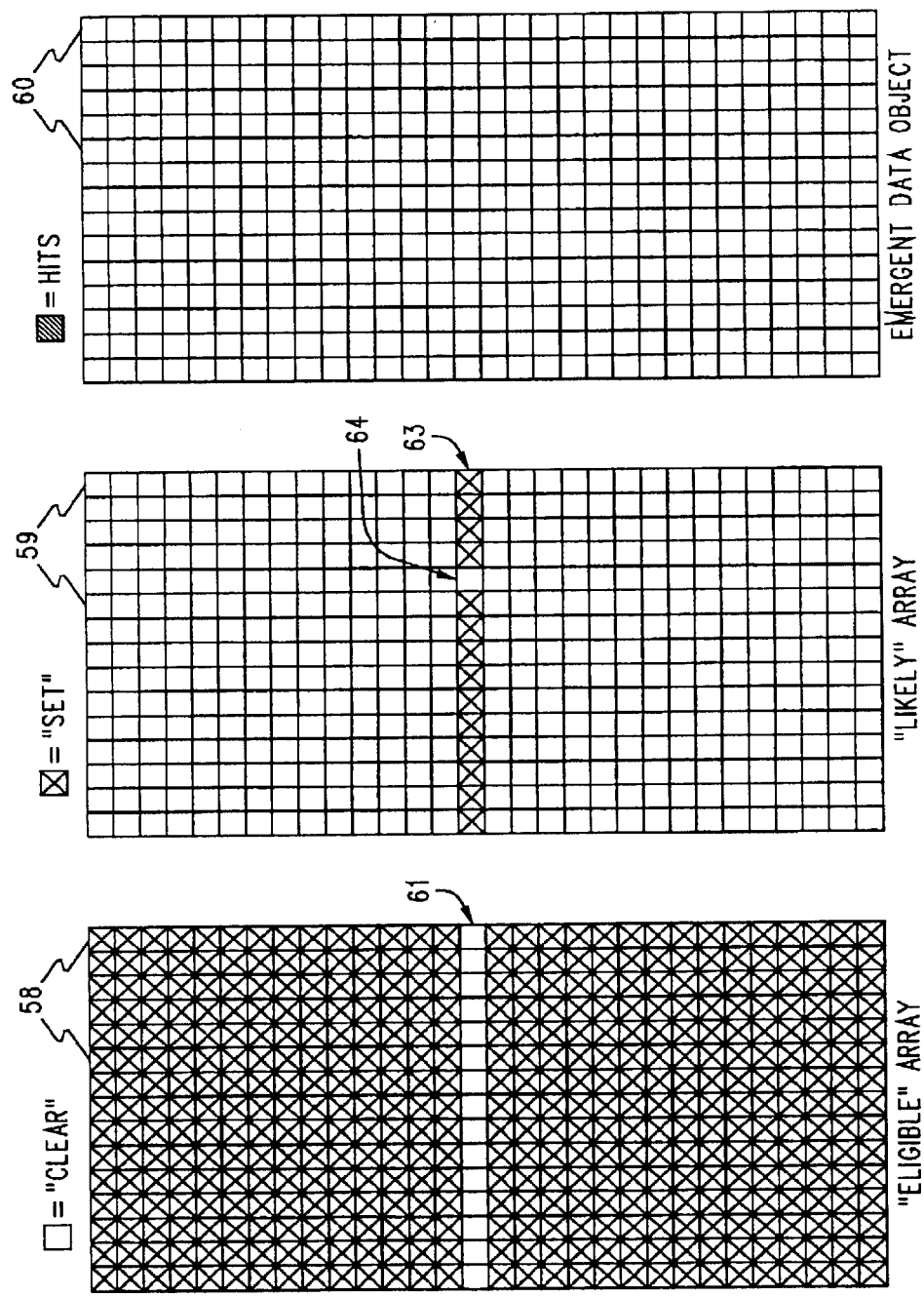
FIG. 7 depicts that sampled locations in the LIKELY array that do not produce hits are simply deleted.

Now, using known pseudo random techniques, we select a set location at random from the LIKELY array 59. (At the start those set locations are all nicely contiguously grouped along line 63. In due course it will be appreciated that the contents of array 59 will not remain so tidy. For now, just remember that whatever resolution rectangles are marked LIKELY, we pick one at random.) Referring now to FIG. 7, where line 62 of FIG. 6 is now denoted as line 63, note that location 64 has been cleared. That is because it was the random selection, and the one that has now been measured by the eye diagram analyzer. A look at (the cheat sheet of) FIG. 4 reveals that there will be no hit. Accordingly, there is no addition to array 60, and all that happens is location 64 "gets used up" and "goes away."

Figure 8:
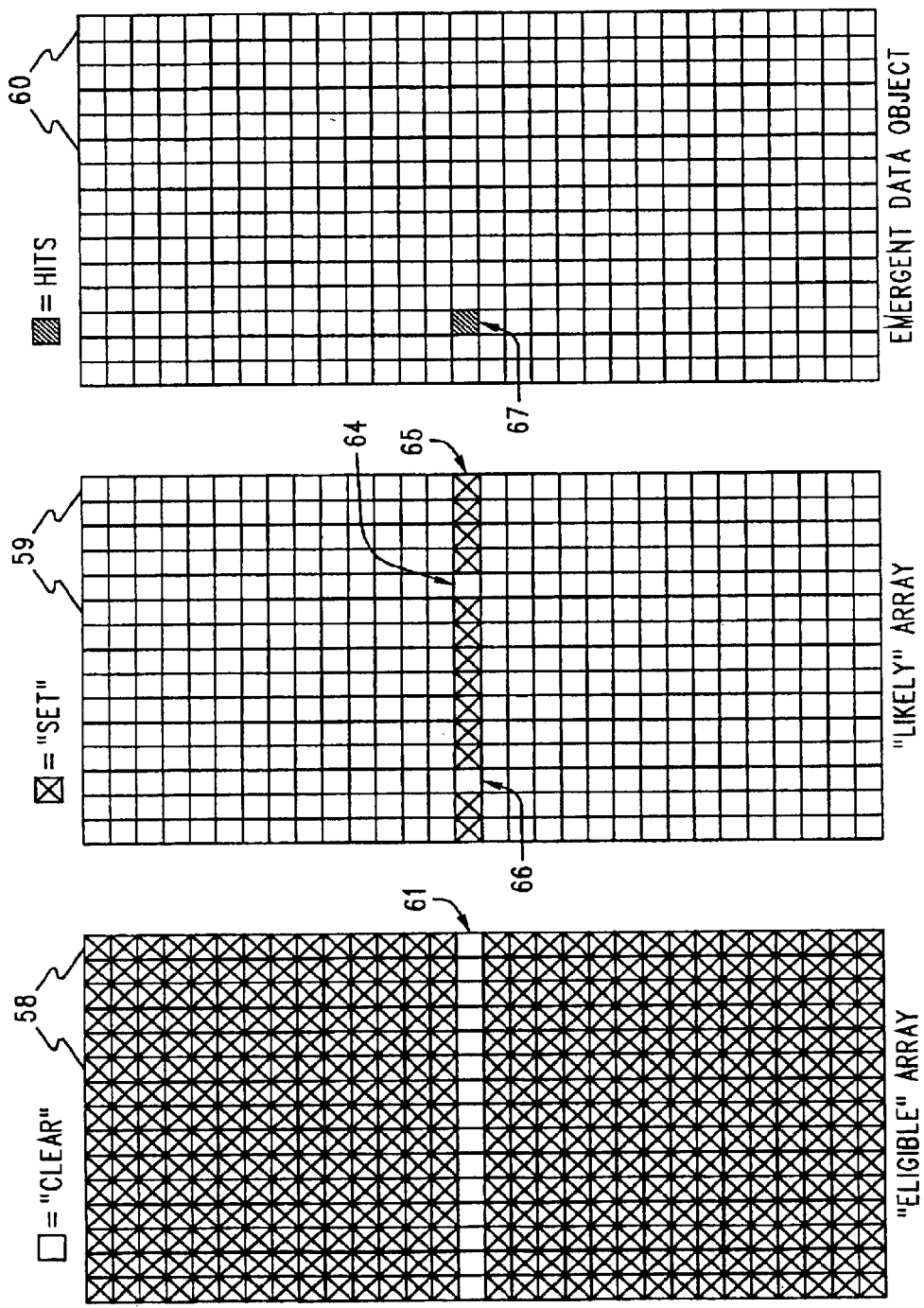
FIG. 8 depicts that sampled locations in the LIKELY array that do produce hits have the hit recorded in an EMERGENT DATA OBJECT array.

So (and with reference now to FIG. 8), we randomly pick another location (66) from among the eligible locations in array 59, which still resembles a line that is now denoted as 65, since that very selected location (66) thereon has been removed for measurement (via the pseudo random selection). This time the measurement hardware does get a hit (check with FIG. 4), which is registered by a suitable quantity being stored in location 67 of the EMERGENT DATA OBJECT array 60.

Figure 9:
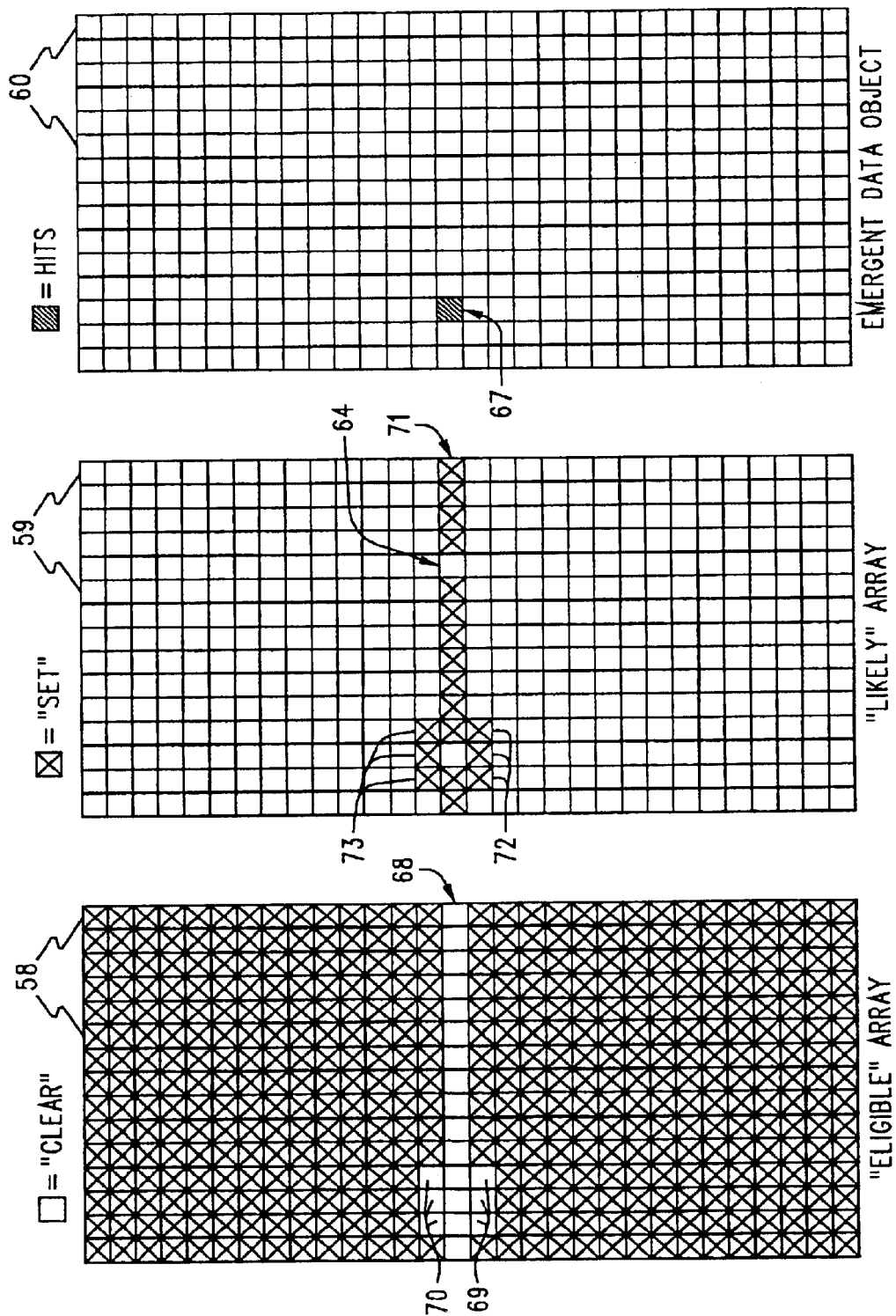
FIG. 9 depicts that sampled locations in the LIKELY array that produce hits also promote nearest neighbors of that location from the ELIGIBLE array into to LIKELY array.

At last we know a location along the eye diagram. This will let us select additional likely candidates for future measurement. According to the algorithm, we are interested in the eight nearest neighbors of the location (66) that produced a hit. Those eight nearest neighbors are: the locations immediately above and below, to the left and right, and along the diagonals of upper left, upper right, lower left and lower right. What we do is go back to the ELIGIBLE array and promote to LIKELY any such corresponding locations that are still set. See FIG. 9. In this case there are only six: three indicated by reference number 69 and another three indicated by reference number 70. Note that in FIG. 9 corresponding locations 72 and 73 have also been set in the LIKELY array 59. The idea is that, since eye diagrams are generally contiguous collections of hits, some of those X's 72 and 73 are in locations that will also produce hits.

Figure 10:
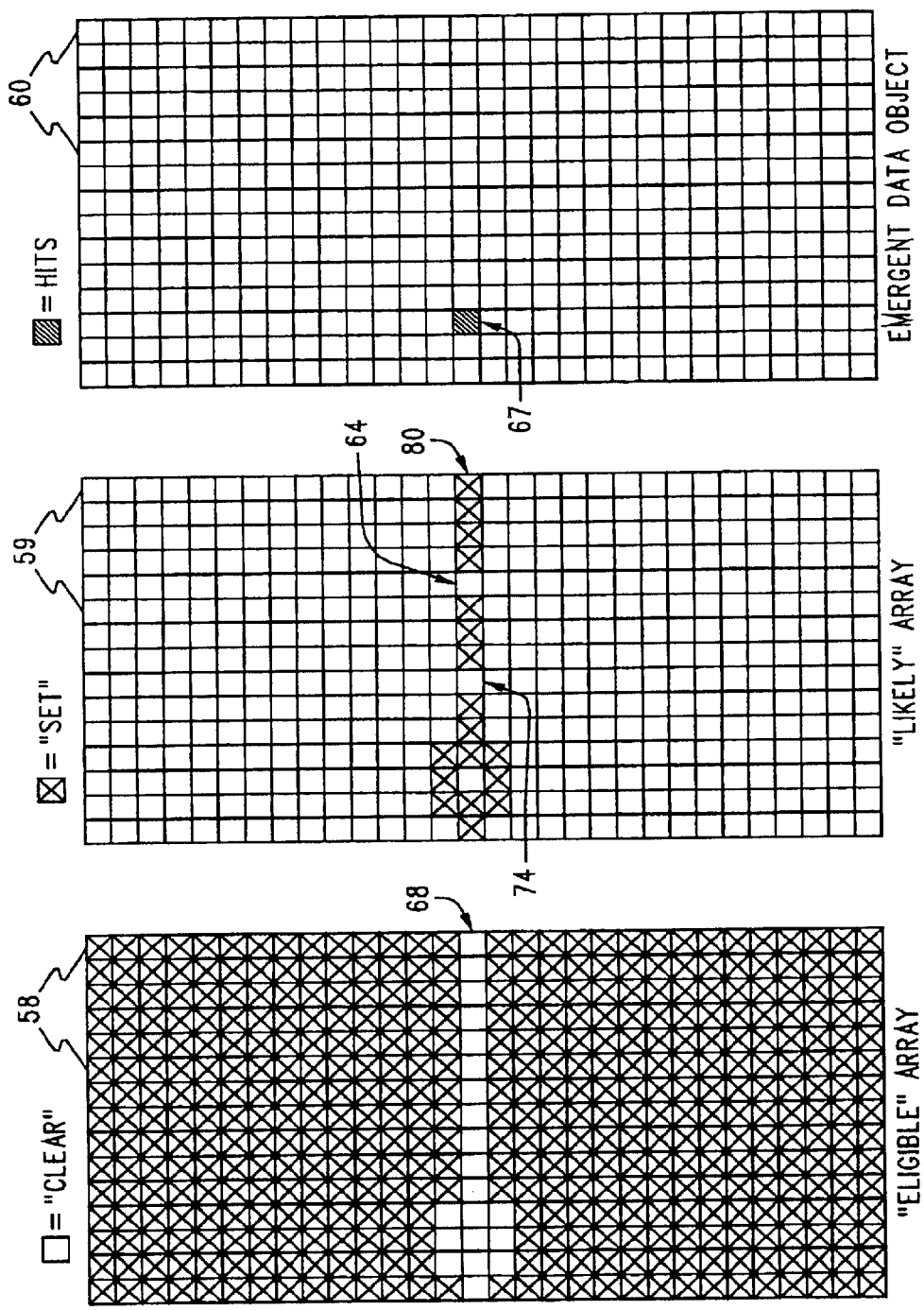
FIG. 10 depicts that randomly selected locations in the LIKELY array still might not produce hits, and that these are, as before, deleted.

To continue, refer now to FIG. 10, where the measurement algorithm selects at random another location (74) from among the collection 80 of likely locations indicated by X's in LIKELY array 59. Checking with FIG. 4, we see that the measurement hardware will not produce a hit. So location 74 is simply removed from the LIKELY collection 80, and another location therein is randomly selected. There is no entry added to the data structure of the EMERGENT DATA OBJECT of array 60.

Figure 11:
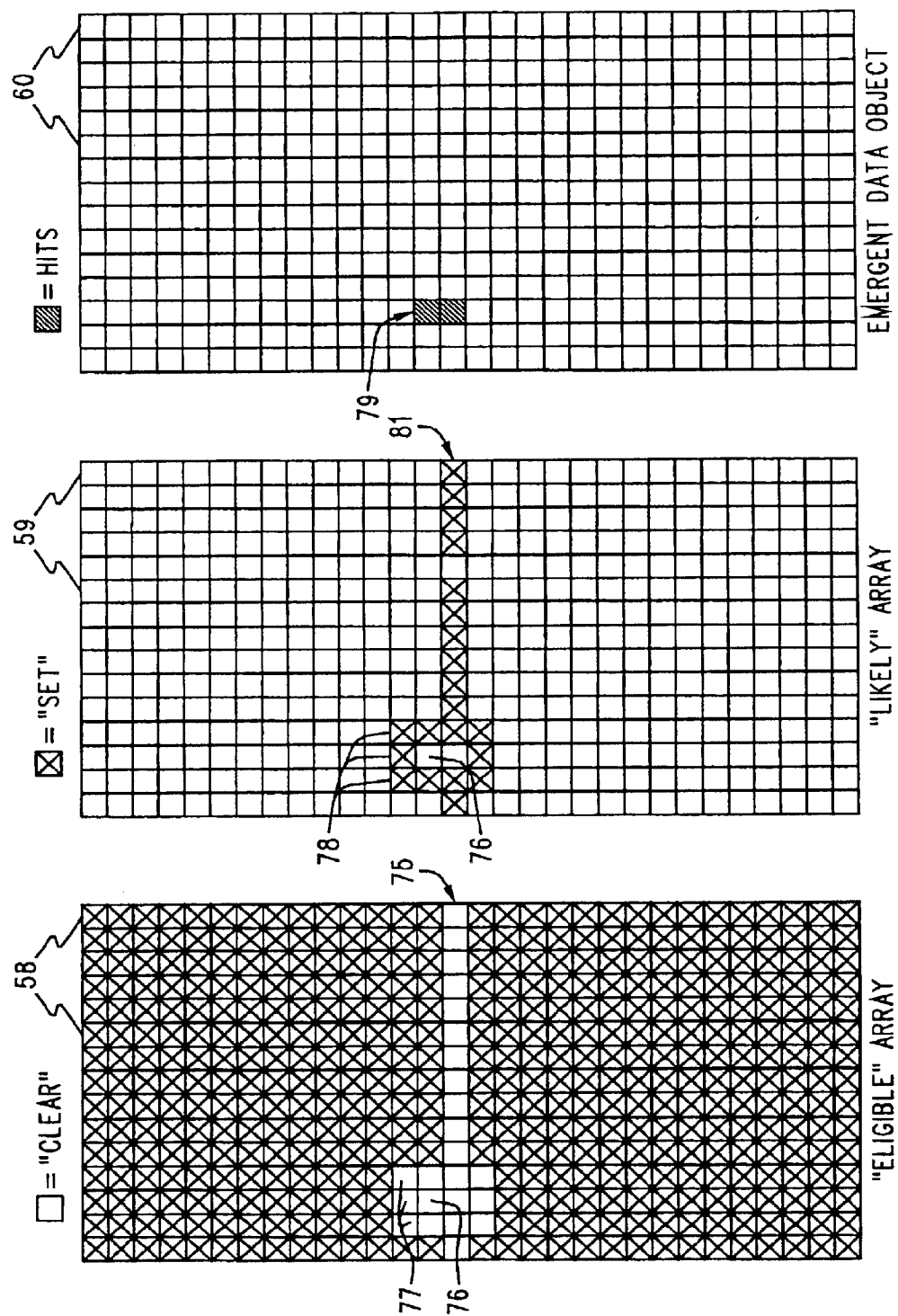
FIG. 11 depicts the gradual build-up of the discovered eye diagram in the EMERGENT DATA OBJECT array as the nearest neighbor traverse proceeds under the control of the contents of the ELIGIBLE and LIKELY arrays.

This bring us to FIG. 11. Assume that location 76 of LIKELY collection 81 is randomly selected for measurement. That location is, of course, then removed from the LIKELY collection. But it does (according to FIG. 4) produce a hit. So the corresponding location 79 in the array 60 gets the appropriate quantity produced by the measurement. Furthermore, we once again promote nearest neighbors from the ELIGIBLE array 58 into the LIKELY array 59. Of course, we only promote those locations that are still eligible (if they have already been promoted they are no longer eligible!), which in this case are the three locations indicated by the reference number 77. They re-appear in the LIKELY array as locations 78.

We continue in this manner, selecting trial locations for measurement from the LIKELY array 59 until it no longer contains any set locations. It will be noted that, although we didn't show it, quite likely the contents of the EMERGENT DATA OBJECT array 60 will initially contain two (or maybe even more) disjoint "colonies" of locations that will, as the algorithm proceeds, "grow" toward one another. Hits are wherever they are found, and they will have their own nearest neighbors, and so on. That is, rather than location 74 (see FIG. 10) having been a "dud" (since it does not lie on the eye diagram 57 of FIG. 4), it could as easily have been at a location that produced a hit on the lower portion of the eye diagram 57. Then the collection of hits (as well as the activity for the ELIGIBLE and LIKELY bits) "forks" and each grows independently. We now touch on a number of loose ends and alternatives.

To begin with, it might happen that a hit occurs on an edge or boundary of the sample space, with the consequence that some locations that would otherwise be "nearest" are not available (since they lie beyond the boundary). In that case we have to decide what set of corresponding locations (two such sets of locations if the hit was on a corner) to designate as "nearest." For left and right boundaries (i.e., along the time axis) we "wrap around" to the opposite side, so that a location "one too far on the right" turns into one that is "just barely inside" on the left, all at the given voltage. For the voltage axis we could wrap in a corresponding way, or, simply through the outside points away. The rationale for throwing them away is that there is no modulo nature to the voltage measurement, as there is with recurrent sampling in time along a periodic waveform. On the other hand, there is a rationale for wrapping if the waveform being measured exhibits good top-to-bottom symmetry about a horizontal axis. Then a hit near the top (say) suggests the possibility of a corresponding hit near the bottom and at the same location along the time axis. It also suggests that either the operator or the automatic range selection mechanism misjudged the voltage excursion situation. In turn, there is yet a third possibility for hits that fall on a voltage boundary of the sample space. That is to enlarge the sample space along that portion of the voltage axis (assuming, of course, that the measurement hardware was not already at its limit). So, if the upper boundary of the sample space were two volts, and we got a hit at two volts, then we could simply pause briefly and enlarge the sample space to, say, two and one tenth volts. During such a pause the various arrays 58, 59 and 60 are augmented to be of a size they would have been had they been thus formed to begin with, and (of equal importance), the new portions are retroactively initialized and the "starter" line extended, all as if it had been that way all along. Then the measurement can resume. The practicality of this strategy is aided by the fact that the measurement data produced in the EMERGENT DATA OBJECT array 60 can be pixilized, annotated and displayed under the new conditions without affecting the validity of any of the previously collected data. The fact that a partially formed display is tossed out in favor of a new one should not be viewed as a wasted operation, but rather as an artful recovery that avoids potentially restarting the entire measurement with changed criteria.

Next, it may be desirable to supplement the original vertical "starter" line of likely locations (collection 62 in FIG. 6) with a corresponding horizontal line, or two horizontal lines. Then there is the question of when to stop. It may well happen that LIKELY array 59 will become completely cleared while there still remain set locations in the ELIGIBLE array 58. That, in fact, is the hope, since if that does not happen we have not achieved any improvement. Nevertheless, it may be desirable to give the user the option of indicating to the EDA that it is to resume (or never stop in the first place) until the ELIGIBLE array 58 is totally clear. Even when the user so indicates, he still gets to see the emerging eye diagram "as soon as possible" (well, at least sooner than otherwise), and he may want to see the whole thing, anyway. Why might this be a desirable mode of operation? Well, aside from simple preference on the part of the operator, we note that it can be the case that an eye diagram can have detached portions. That is, that an eye diagram taken by sampling means might not appear as contiguous locations. To be sure, this would imply that the signal was too fast for the resolution rectangle in use, but even so, it is wise to be able to cope with such a case. Since the nearest neighbor algorithm we have described "follows the contiguous dots" so to speak, it is not able to "get onto" a detached collection of hits not contiguous with the first "starter line" of LIKELY locations (62). This is the basis for the title of this application using the term "basic eye diagrams." The expectation is that the nearest neighbor technique will discover the "basic" eye diagram, even if some peculiar (detached) artifacts might remain unshown (unless the operator instructs the EDA to run to completion). Such a run to completion could be a simple ordered raster-like scan for the remaining ELIGIBLE locations, or those locations could be looked at randomly. The easiest way to accomplish the random completion is to simply promote all remaining ELIGIBLE locations into the LIKELY array and then resume the algorithm.

As an alternative, or perhaps in addition, if it were felt that detached collections were never too far away from the main path, then it might be desirable to specify "near neighbors" instead of just the nearest ones. That is, consider promoting from ELIGIBLE to LIKELY two or three layers of locations surrounding a hit, rather than just the single layer we described in connection with FIGS. 5–11.

A further variation on the idea of enlarging the collection of nearest neighbors is to identify a square (or some other shape, say octagonal) with the latest hit at its center. Suppose we chose a square, five locations on a side (on odd number is nice, since it is symmetrical about a central location). But, instead of promoting all the locations surrounding the center, for the outer layers an alternating or checkerboard pattern is first imposed, such that only every other location in the square is promoted. Or, for the outermost layers of a larger shape, randomly chosen locations therein could be promoted (we think it wise to always promote the very nearest neighbors). A further refinement is to vary the likelihood of promotion as a function of distance from the hit at the center. The idea is to avoid exhaustive checks that consume time, in favor of "playing the odds," as it were, to discover other locations on the eye diagram, especially if they are "close" but detached. It will be noted that if there are no detached portions the basic nearest neighbor traverse will indeed discover the entire eye diagram once any part of it is initially discovered. But to discover detached portions requires additional searching, and the idea here is to perform such searching near where other eye diagram activity has already been found.

We should discuss the notion of how the "size" or edges of the sample space are selected or specified. On the one hand there are modes of EDA operation where the EDA itself samples the signal in a preliminary and investigatory manner to discover likely good choices. On the other hand the operator may know enough about the signals ahead of time, or have specific wants, that he may simply specify the limits himself. The nearest neighbor traverse algorithm is compatible with either way.

Finally, here is a simplified procedural description of the algorithm:

1. Identify the limits of the sample space.
2. Corresponding ELIGIBLE, LIKELY and EMERGENT DATA OBJECT arrays are created and initialized. All locations in the ELIGIBLE array are set and all locations in the other two arrays are cleared.
3. Select at least one "starter line" in the ELIGIBLE array and promote it into the LIKELY array. A preferred starter line is a line of locations all at the same time location and adjacent in the voltage axis. The preferred time location is near the transition in the clock signal used as a measurement reference for the overall eye diagram measurement.
4. Promote the starter line from the ELIGIBLE array into the LIKELY array. Such promotion means that the corresponding locations are cleared in the ELIGIBLE array and set in the LIKELY array.
5. Randomly select a set location in the LIKELY array and perform a measurement of the signal at that location. If there are no set locations to select, skip to step 8, else delete the location just measured from the LIKELY array.
6. If a location measured in step 5 is a dud (miss), repeat step 5.
7. If a location measured in step 5 is a hit, then promote those locations in the ELIGIBLE array that are both set and nearest neighbors of that hit into the LIKELY array. Record the location of the hit in the EMERGENT DATA OBJECT array. Nearest neighbors that lie beyond a border of the sample space are preferably allowed to wrap. Repeat step 5.
8. Optionally promote from ELIGIBLE to LIKELY as further "starter lines" any still eligible locations lying on horizontal lines at the upper and lower voltage limits of measured signal activity. Pairs or triples of adjacent lines of constant voltage may be used at these extremes, if desired. It may also be desirable to promote a horizontal line midway between the upper and lower voltage extremes to ensure that the transition region of the eye is discovered if it should be the case that the upper and lower horizontal edges of the eye diagram are (for whatever reason) off-screen. If locations are promoted in this step, then go to step 5, else if no locations are promoted, go to step 9.

9. Stop the traverse if a complete scan is not desired, else go to step 10.

10. Finish the scan by measuring the remaining locations. A preferred way to this is to set promote all remaining ELIGIBLE locations to LIKELY and return to step 5.

It will be appreciated that there are certain variations on the above procedure that fall within the spirit and scope of the nearest neighbor traverse. For example, one could interchange the roles of the vertical initial starter lines of step 3 and the horizontal further starter lines of step 8.

I claim:

1. A method of selecting the order for sampling signal values to create an eye diagram, the method comprising the steps of:

(a) defining a sample space having a time axis whose values are relative to a transition in a reference signal and having a voltage axis;

(b) selecting a time resolution $\Delta t$ and a voltage resolution $\Delta v$;

(c) defining an array E indexed by an ordered pair of indices (x, y), where x represents consecutive multiples of $\Delta t$ and y represents consecutive multiples of $\Delta v$, and $E(x, y)_i$ is one of xy-many elements within E and corresponds to a location in the sample space;

(d) defining an array L indexed by the ordered indexes (x, y), where $L(x, y)_i$ is one of xy-many elements within L and corresponds to a location in the sample space;

(e) defining an array H indexed by the ordered indexes (x, y), where $H(x, y)_i$ is one of xy-many elements within H and corresponds to a location in the sample space;

(f) storing in each element of E a symbol e representing that the corresponding location in the sample space is eligible to be measured;

(g) storing in each element of L a symbol $-l$ representing that the corresponding location in the sample space is not a likely candidate for measurement;

(h) storing in each element of H a null symbol $\emptyset$ representing that the corresponding location in the sample space has not produced any hits;

(i) subsequent to steps (a)–(h), storing at selected locations in L a symbol l representing that those corresponding locations in the sample space are to be measured, and storing at those same selected locations in E a symbol $-e$ representing that each corresponding location is no longer eligible for measurement;

(j) pseudo randomly selecting a location $L(x, y)_i$ in L that contains the symbol l, and if there is such a location proceeding with steps (k)–(n), otherwise proceeding to step (t);

(k) storing the symbol $-l$ in $L(x, y)_i$;

(l) measuring the signal at the location in the sample space corresponding to $(x, y)_i$ and producing a value $h(x, y)_i$;

(m) if the value $h(x, y)_i$ measured in step (l) corresponds to the null symbol $\emptyset$, repeating steps (j)–(l); otherwise (n) if the value $h(x, y)_i$ measured in step (l) does not correspond to the null symbol $\emptyset$, performing steps (o)–(r);

(o) storing the value $h(x, y)_i$ measured in step (l) into the array H at location $H(x, y)_i$;

(p) identifying the nearest neighbor locations of the location $(x, y)_i$;

(q) storing into L the symbol l at nearest neighbor locations that were identified in step (p) and that hold the symbol e in the array E;

(r) for each location of L stored into by step (q), storing the symbol $-e$ into the array E at the corresponding location; then (s) repeating step (j); and (t) cease the sampling of signal values to create the eye diagram.

2. A method as in claim 1 wherein the selected locations of step (i) comprises a column of adjacent y values at an x value proximate the midpoint of the time axis.

3. A method as in claim 1 wherein the selected locations of step (i) comprises a row of adjacent x values at a y value proximate the midpoint of the voltage axis.

4. A method as in claim 1 wherein the nearest neighbor locations identified by step (p) are the eight locations defining the perimeter of a square three locations on a side and that has the location $(x, y)_i$ at its center.

5. A method as in claim 4 wherein the nearest neighbor locations identified by step (p) further include an additional sixteen locations defining the perimeter of a square five locations on a side and that has the location $(x, y)_i$ at its center.

6. A method as in claim 1 wherein a nearest neighbor location identified by step (p) and lying by a first amount beyond a boundary of the sample space is construed as being a corresponding location inside an opposite parallel boundary by the first amount.

7. A method as in claim 1 further comprising the step of determining that a nearest neighbor location identified by step (p) lies beyond a boundary of the sample space, and then subsequently enlarging the arrays E, L and H to include that location.

8. A method as in claim 7 further comprising the steps of storing the symbol e in the newly added locations of E, storing $-l$ in the newly added locations of L and storing $\emptyset$ in the newly added locations of H.

9. A method as in claim 1 wherein step (t) comprises the steps:

(t1) determining the minimum and maximum values $y_{min}$ and $y_{max}$ of the index y for which $h(x, y)_i \neq \emptyset$ were produced; then (t2) storing l at each location in L having $y_{min}$ and having $y_{max}$ as an index and for which the corresponding location in E contains the symbol e; then (t3) storing $-e$ at each location in E for which l was stored in L during step (t2); then (t4) if an l was stored in step (t2), then repeating step (j); otherwise (t5) ceasing the sampling of signal values to create the eye diagram.

10. A method as in claim 1 wherein step (t) comprises the steps:

(t1) measuring all unvisited locations remaining in the sample space, as indicated by the presence of the symbol e in the array E; and then (t2) ceasing the sampling of signal values to create the eye diagram.

11. A method as in claim 1 wherein the nearest neighbor locations identified by step (p) lie within a shape composed of a plurality of layers of locations surrounding the location $(x, y)_i$, and wherein only selected locations in the plurality of layers are identified by step (p).

12. A method as in claim 1 wherein at least two of the arrays E, L and H are components in a data structure indexed by the indices x and y, and the elements of the arrays that are components in the data structure are data items within fields defined in the data structure.

* * * * *